(12) United States Patent
Mahadevan et al.

(10) Patent No.: US 7,030,469 B2
(45) Date of Patent: Apr. 18, 2006

(54) METHOD OF FORMING A SEMICONDUCTOR PACKAGE AND STRUCTURE THEREOF

(75) Inventors: Dave S. Mahadevan, Mesa, AZ (US); Michael E. Chapman, Gilbert, AZ (US); Arvind S. Salian, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 14 days.

(21) Appl. No.: 10/670,631

(22) Filed: Sep. 25, 2003

(65) Prior Publication Data

US 2005/0067676 A1 Mar. 31, 2005

(51) Int. Cl.
*H01L 23/552* (2006.01)

(52) U.S. Cl. ..................................... 257/659
(58) Field of Classification Search ............ None
See application file for complete search history.

(56) References Cited

U.S. PATENT DOCUMENTS

| | | | |
|---|---|---|---|
| 5,166,772 A | | 11/1992 | Soldner |
| 5,317,107 A | * | 5/1994 | Osorio ...................... 174/52.4 |
| 5,545,912 A | * | 8/1996 | Ristic et al. ................ 257/417 |
| 5,557,141 A | | 9/1996 | Harada et al. |
| 5,635,754 A | * | 6/1997 | Strobel et al. .............. 257/659 |
| 5,650,659 A | * | 7/1997 | Mostafazadeh et al. ..... 257/660 |
| 5,679,975 A | * | 10/1997 | Wyland et al. .............. 257/659 |
| 6,011,698 A | | 1/2000 | Buehler |
| 6,414,849 B1 | | 7/2002 | Chiu |
| 6,507,101 B1 | | 1/2003 | Morris |
| 6,515,870 B1 | | 2/2003 | Skinner |

FOREIGN PATENT DOCUMENTS

| | | |
|---|---|---|
| GB | 2077036 A | 12/1981 |
| WO | WO94/01807 | 1/1994 |

* cited by examiner

*Primary Examiner*—David A. Zarneke
(74) *Attorney, Agent, or Firm*—Kim-Marie Vo

(57) ABSTRACT

An electromagnetic interference (EMI) and/or electromagnetic radiation shield is formed by forming a conductive layer (42, 64) over a mold encapsulant (35, 62). The conductive layer (42, 64) may be electrically coupled using a wire to the leadframe (10, 52) of the semiconductor package (2, 50). The electrical coupling can be performed by wire bonding two device portions (2, 4, 6, 8) of a leadframe (10) together and then cutting the wire bond (32) by forming a groove (40) in the overlying mold encapsulant (35) to form two wires (33). The conductive layer (42) is then electrically coupled to each of the two wires (33). In another embodiment, a looped wire bond (61) is formed on top of a semiconductor die (57). After mold encapsulation, portions of the mold encapsulant (62) are removed to expose portions of the looped wire bond (61). The conductive layer (64) is then formed over the mold encapsulant (62) and the exposed portion of the looped wire bond (61) so that the conductive layer (64) is electrically coupled to the looped wire bond (61).

11 Claims, 4 Drawing Sheets

METHOD OF FORMING A SEMICONDUCTOR PACKAGE AND STRUCTURE THEREOF

FIELD OF THE INVENTION

This invention relates generally to semiconductor devices, and more specifically, to semiconductor packages.

BACKGROUND

Semiconductor devices need to be protected from electromagnetic waves emitted into the atmosphere from other products. For example, spark plugs firing in a car can create electromagnetic waves that adversely interfere with a microcontroller mounted under the hood of a car. Conventional packages do not protect the semiconductor devices within them from electromagnetic waves.

To prevent electromagnetic interference, groups of semiconductor devices are placed in a module or box. The module shields the semiconductor devices from electromagnetic interference (EMI). Even though using the module may provide overall EMI protection from outside interference, semiconductor devices inside the module can still interfere with each other. With low cost requirements and increased complexity of systems there is a need for a semiconductor packages themselves to shield electromagnetic waves so that the semiconductor devices can be placed in various parts of the car with or without a module. For example, to detect collisions from different directions appropriate sensors are located at various locations in the car. Furthermore, sensors without EMI protection cannot be grouped in the same module with other semiconductor devices if the latter produce EMI. It becomes costly to place each sensor in an individual module for electromagnetic protection.

One solution to prevent electromagnetic interference is to place a metal cap over a semiconductor device prior to molding the package. This solution is only applicable to ball grid array (BGA) packages which encapsulate a large semiconductor die (i.e., at least one inch squared). Therefore, a need exists for a solution for component level EMI shielding that can be used in a variety of packages with any semiconductor die size.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
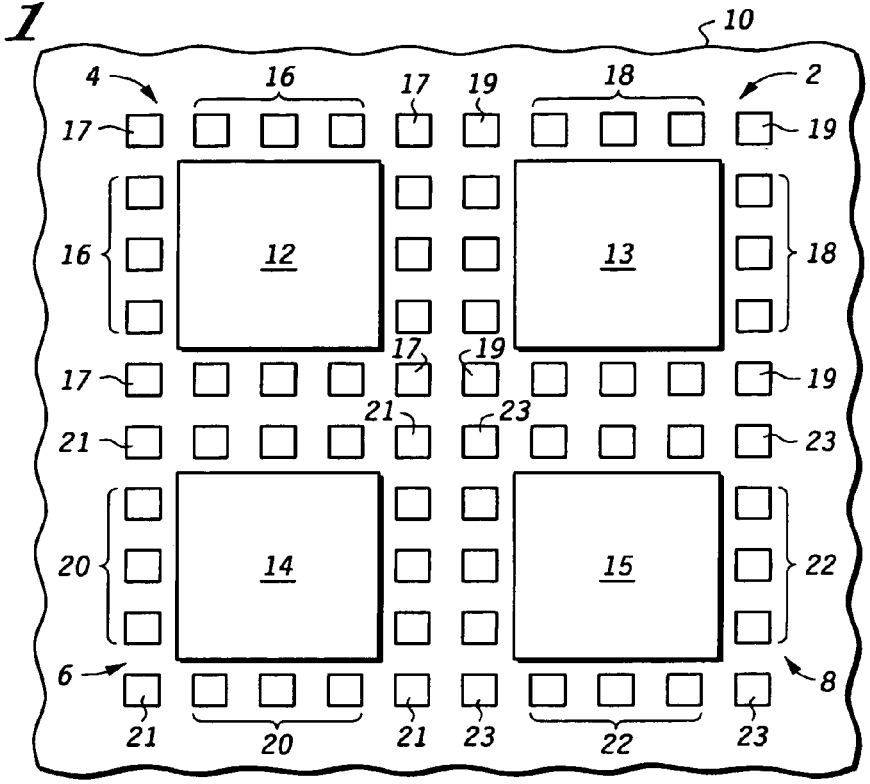
FIG. 1 illustrates a top view of a section of a leadframe including four parts in accordance with an embodiment of the present invention.

Illustrated in FIG. 1 is a portion of a leadframe 10 which includes a first device portion 4, a second device portion 2, a third device portion 8, and a fourth device portion 6. The leadframe 10 can be a leadframe for any package, such as a quad-flat no-lead (QFN) package, which is also referred to as the microleadframe package (MLF) and bump chip carrier (BCC); a ball grid array (BGA) package; quad flat package (QFP); or any other package that can be formed using a molding process or is formed by singulating, as will be explained in more detail below. The leadframe 27 can be any conductive material such as an alloy including nickel and iron; nickel palladium; or the like. The leadframe 10 can be purchased as a patterned leadframe with bond pads and ground pads already formed in a desired pattern. If the leadframe 10 is not purchased with the desired formation of the bond pads or ground pads, the bond pads and ground pads can be formed by patterning and etching the leadframe 10. Ground pads are bond pads that are dedicated to be used to couple an EMI shield, conductive layer or device to ground.

Although only four device portions are illustrated in FIG. 1, many more device portions may exist. For example, the leadframe 10 may include 100–200 device portions. In the embodiment shown, each of the device portions, have the same structures for simplicity of manufacturing; however, it is not necessary.

The first device portion 4 includes a first flag first receiving area for a die) 12 surrounded by first bond pads 16 and first ground pads 17. The first flag 12 is not limited to the rectangular shape shown in FIG. 1. Instead, the first flag 12 may be an open window within the leadframe 10, "X-shaped", or the like. Furthermore, the first flag may be elevated or indented relative to other areas of the leadframe 10. In the embodiment illustrated, the first bond pads 16 are parallel to the sides of the first flag 12 and the first ground pads 17 are located at the four corners of the first flag 12. (Only two sets of the first bond pads 16 are numbered to avoid cluttering the figures. However, all three boxes between the first ground pads 17 on each side of the first flag 12 are bond pads.) In addition, a skilled artisan should recognize that the number of first bond pads 16 drawn and their configuration is illustrative only. Any number of first bond pads 16 may be present and each side of the first flag 12 may not have identical numbers of first bond pads 16. Furthermore, the first bond pads 16 may be staggered relative to each other along each side of the first flag 12 or any other suitable configuration may be used. Also, the first ground pads 17 can have a different configuration or location.

The second device portion 2 includes a second flag 13 surrounded by second bond pads 18 and second ground pads 19. The third device portion 8 includes a third flag 15 surrounded by third bond pads 22 and third ground pads 23. Similarly, the fourth device portion 6 includes a fourth flag 14 surrounded by fourth bond pads 20 and fourth ground pads 21. The second, third, and fourth flags 13, 15 and 14 can be any shape disclosed for the first flag 12. The second, third and fourth bond pads 18, 22, and 20 are similar to the to the first bond pads 16 and can have any configuration like the first bond pads 16. (Like the first bond pads 16, not all of the second, third and fourth bond pads 18, 22, and 20 are labeled with numbers to avoid cluttering FIG. 1.) Likewise, the second, third and fourth ground pads 19, 23, and 21 are similar to the first ground pads 17.

Semiconductor dies are cut from a semiconductor wafer and placed on each of the flags using a pick and place tool, as known in the industry. In other words, a first semiconductor die 24, a second semiconductor die 25, a third semiconductor die 27, and a fourth semiconductor die 26 are placed on the first flag 12, the second flag 13., the third flag 14, and the fourth flag 15, respectively. In one embodiment, one semiconductor die is places on each flag. In another embodiment, more than one semiconductor die is placed over a flag. For example, a semiconductor die can be placed adjacent another semiconductor die on the same flag or can be stacked over another semiconductor die placed on the same flag. Thus, a plurality of die can be placed on a flag within the same plane or stacked relative to each other.

The first, second, third and fourth semiconductor dies 24–27 include semiconductor substrates and circuitry, such as transistors and the like. The semiconductor substrates also include die bond pads from which wire bonds may be connected between the die bond pads of the semiconductor dies and the bond pads surrounding each flag. Thus, the first semiconductor die 24 is electrically coupled to the first bond pads 16. In one embodiment, the electrical coupling occurs via first wire bonds 28. Likewise, the second semiconductor die 25, the third semiconductor die 27 and the fourth semiconductor die 26 are each electrically coupled to the second bond pads 18, the third bond pads 20 and the fourth bond pads 22, respectively. In one embodiment, the electrical coupling occurs via second wire bonds 29, third wire bonds 30 and fourth wire bonds 31 for the first, second and third semiconductor dies 25–27, respectively. The wire bonds 28–31 may be any conductive material, such as gold or aluminum. In one embodiment, the diameter of each wire bond 28–31 is approximately $1/1{,}000$–$1/2{,}000$ of an inch in diameter, which is approximately ¼ the diameter of a human hair.

If the semiconductor dies 24–27 are electrically coupled together by wire bonds to the bond pads 16, 18, 20 and 22, then the ground pads of adjacent device portions may also electrically coupled together during the same wire bonding process. In one embodiment, coupling is performed by wire bonding the ground pads to each other using wire bonds that are the same as those that can be used to wire bond a semiconductor die to a bond pad, as described above. However, separate wire bonding processed may be used for coupling the ground pads and the bond pads if the wire bonds used for each differ, for example, in diameter.

Figure 2:
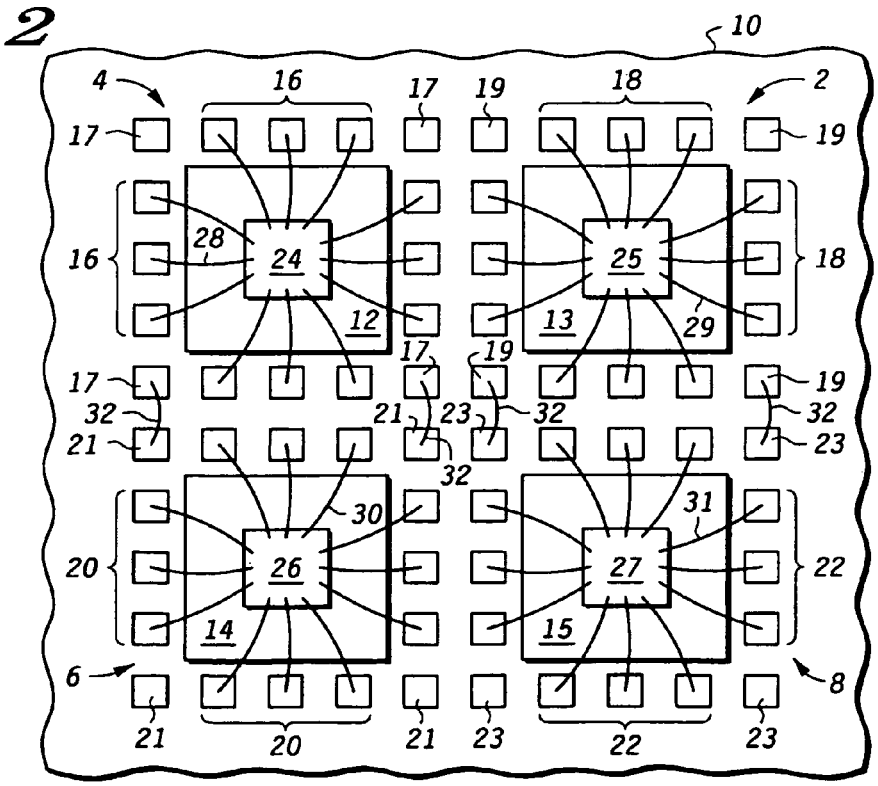
FIG. 2 illustrates a top view of the leadframe of FIG. 1 after wire bonding in accordance with an embodiment of the present invention.

As shown in FIG. 2, the first semiconductor die 24 is electrically coupled to the first bond pads 16, the second semiconductor die 25 is electrically coupled to the second bond pads 18, the third semiconductor die 27 is electrically coupled to the third bond pads 22, and the fourth semiconductor die 26 is electrically coupled to the fourth bond pads 20. Furthermore, two of the first ground pads that are closest to the fourth device portion 6 are electrically coupled to two of the fourth ground pads that are closes to the first device portion 4. Two of the second ground pads that are closest to the third device portion 8 are electrically coupled to two of the third ground pads that are closest to the second device portion 2. In addition, the ground pads 16, 19, 21 and 23 that are not shown to be electrically coupled to any device portions may be electrically coupled to device portions that are not illustrated In the embodiment illustrated in FIG. 2, each ground pad of a device portion is electrically coupled to one ground pad of an adjacent device portion to form grounded electrical connections or ground wire bonds 32. Since the ground wire bonds 32 are thin they can collapse or be destroyed during the subsequent mold encapsulation process. By aligning the ground wire bonds 32 in the direction that a mold encapsulant will flow during the subsequent molding process the ground wire bonds 32 are more likely to keep their shape and not collapse. Instead, if the mold encapsulant flows at ninety (90) degrees to the grounded wire bonds 32, then the grounded wire bonds 32 are likely to collapse. The ground wire bonds 32 in the embodiment shown in FIG. 2 only couple device portions that are vertically adjacent each other because the mold encapsulant will flow from the top of the leadframe 10 to the bottom or vice versa. This embodiment is shown for illustration but does not limit the configuration of the ground wire bonds 32 or the directions the encapsulant can flow. For example, the ground wire bonds 32 may couple device portions that are laterally or horizontally adjacent each other, especially if the mold encapsulant will be flowing in the lateral direction across the devices. To avoid the above described problem with thin wire bonds and mold flow direction, thicker wire bonds can be used with the disadvantage of increased cost. Although the grounded wire bonds are shown in one direction in the figures, the grounded wire bonds can simultaneously be in multiple directions, such as both horizontally and vertically. In one embodiment, a ground pad may have a plurality of wire bonds each coupled to a different device portion.

Figure 3:
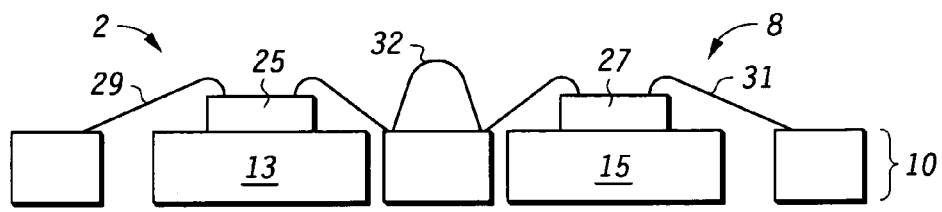
FIG. 3 illustrates a cross-sectional view of FIG. 2 in accordance with an embodiment of the present invention.

FIG. 3 illustrates a cross-sectional view of the second device portion 2 and the fourth device portion 8. Although only some wirebonds are illustrated in FIG. 2, other wire bonds may be present which electrically couple the flag to other portions of the leadframe 10, although they are not shown. In addition, the leadframe 10 in FIG. 3 is shown in various pieces. However, as a skilled artisan recognizes the pieces of the leadframe 10 in FIG. 3 may be coupled together by indexing, flags, leads, dam bars, tie-ins, the like, and combinations of the above. However, to avoid complicating the figures unnecessarily all of parts of the leadframe (e.g., dam bars) are not illustrated.

In FIG. 3 the second device portion 2 and the fourth device portion 8 are electrically coupled via the ground wire bond 32. One of the second wire bonds 29 is shown electrically coupling the second semiconductor die 25 to the second flag 13 and one of the fourth wire bonds 31 electrically couples the fourth semiconductor die 27 to the fourth flag 15.

Figure 4:
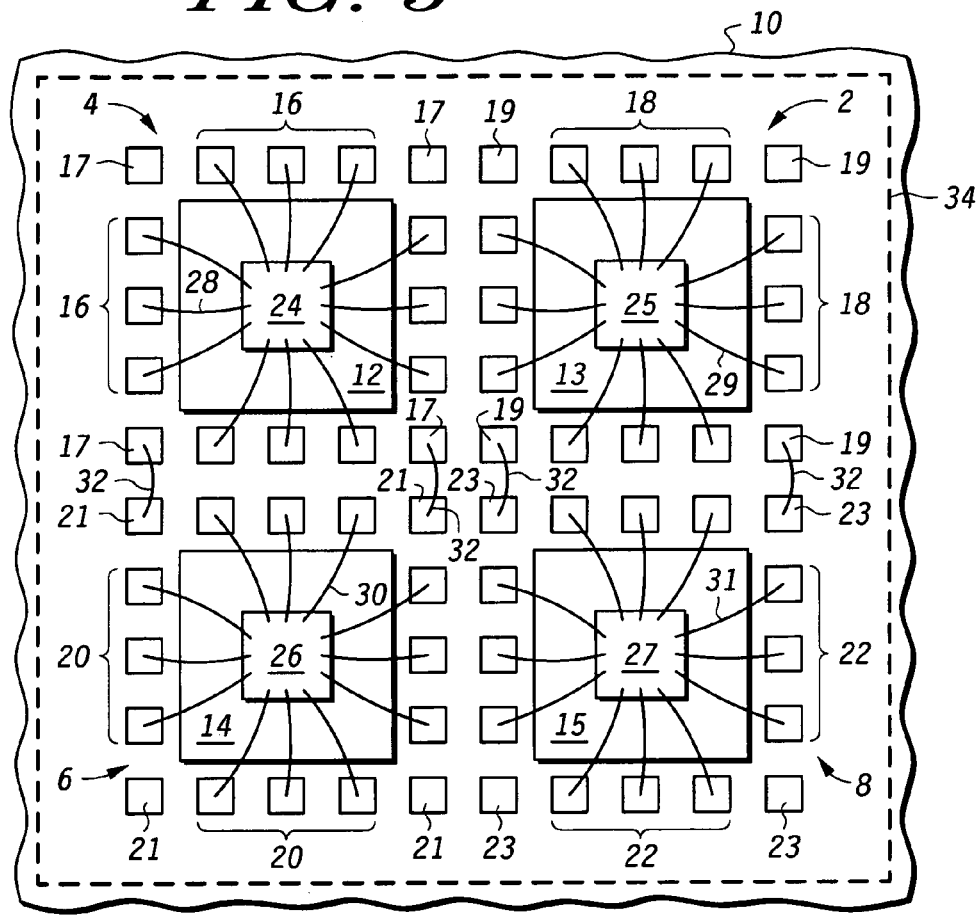
FIG. 4 illustrates a top view of the lead frame of FIG. 2 after forming an encapsulant in accordance with an embodiment of the present invention.

As shown in FIG. 4 after wire bonding or electrically coupling the semiconductor dies, flags and ground pads, an encapsulation process is performed to cover the device portion with a mold compound or mold encapsulant. Dotted line 34 denotes the perimeter of the mold encapsulant.

However, one skilled in the art recognizes that if other portions of devices besides the four shown for illustration are present the mold's perimeter would extend beyond the four device portions shown and over the other device portions. The mold encapsulant may be a silica-filled resin, a ceramic, a halide-free material, the like, or combinations of the above. The mold encapsulant is typically applied using a liquid, which is then heated to form a solid by curing in a UV or ambient atmosphere. The encapsulant can also be a solid that is heated to form a liquid and then cooled to form a solid mold over the lead frame. Any other encapsulant process may be used.

Figure 5:
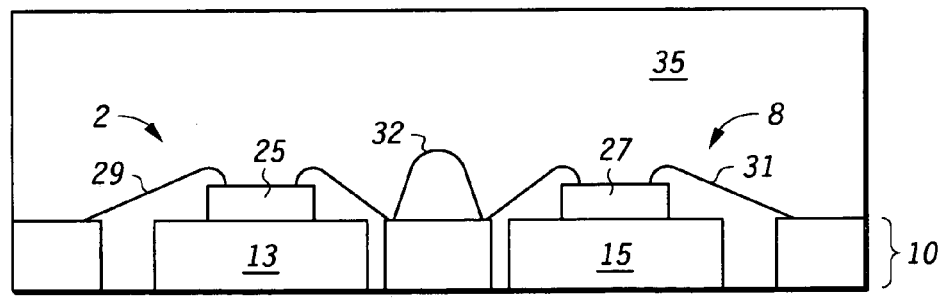
FIG. 5 illustrates a cross-sectional view of FIG. 4 in accordance with an embodiment of the present invention.

In order for a groove to be subsequently cut over the grounded wire bonds, as will be explained in more detail below, the encapsulation process should enclose the grounded wire bonds, which can easily be achieved by molding the whole leadframe 10 as is usually performed in many packaging process, such as a QFN process. The cross-sectional view in FIG. 5 of the second device portion 2 and the fourth device portion 8 after encapsulation illustrates the mold encapsulant 35 covering at least the grounded wire bond 32 and the associated device portions 2 and 8.

Figure 6:
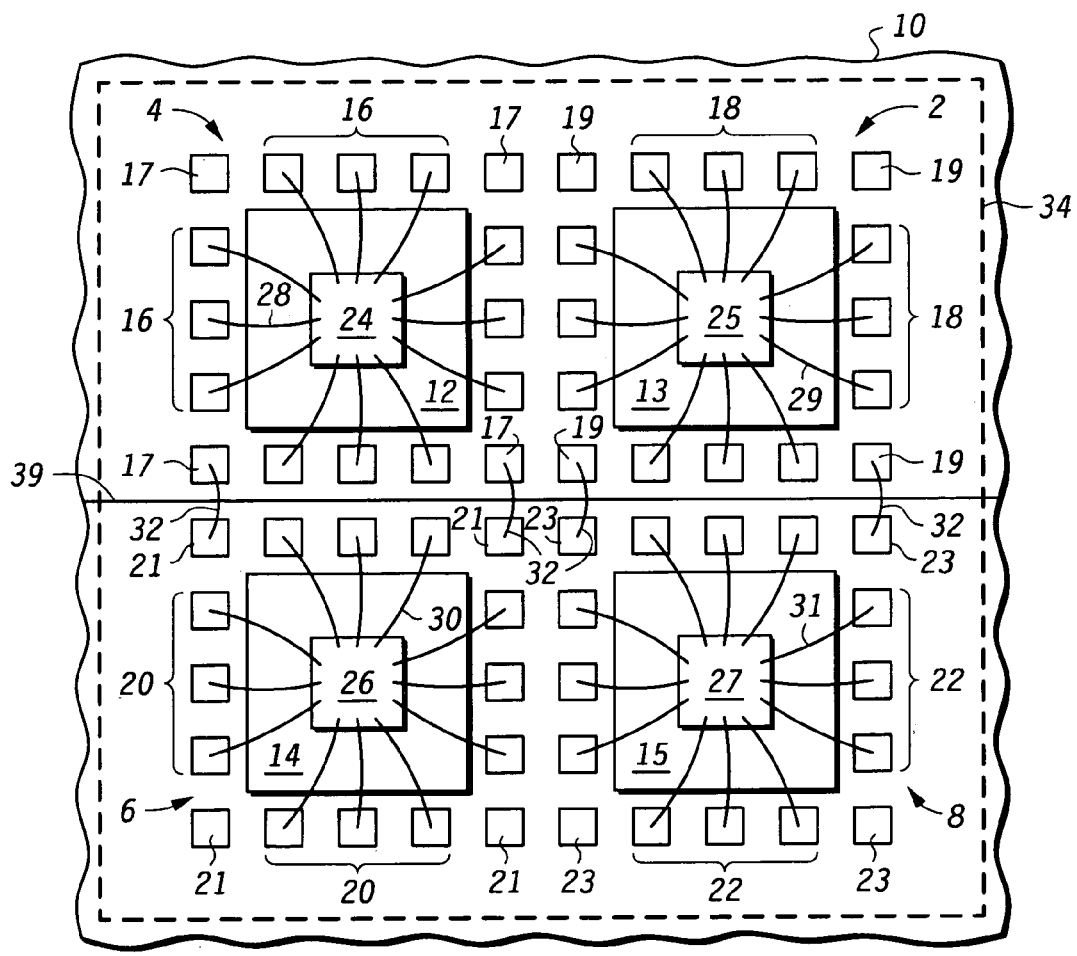
FIG. 6 illustrates a top view of the lead frame of FIG. 4 after cutting a groove in accordance with an embodiment of the present invention.
Figure 7:
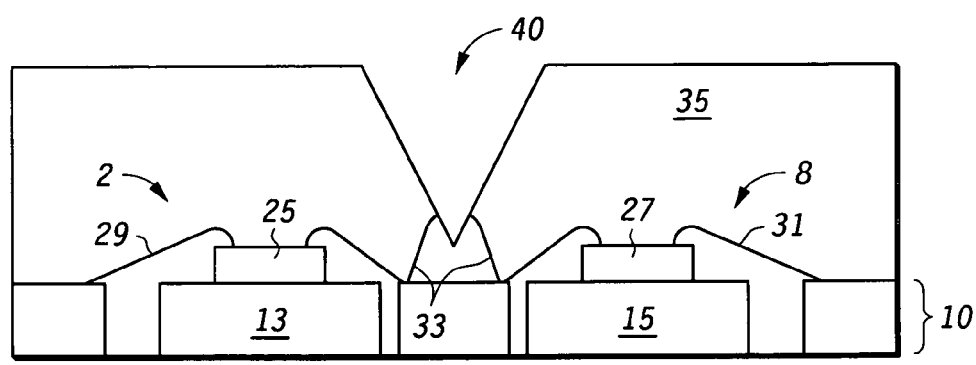
FIG. 7 illustrates a cross-sectional view of FIG. 6 in accordance with an embodiment of the present invention.

After encapsulation, the grounded wire bonds 32 are cut. Line 39 in FIG. 6 illustrates the line along which the cut is made and FIG. 7 illustrates a cross sectional view of a groove 40 resulting from the cut between the second device portion 2 and the fourth device portion 8, which dissects the ground wire bond 32 into two grounded wires 33. The cut may be made with a saw having a cutting blade or any other instrument that can segregate the wire bonds as discussed below. Preferably, the cutting blade has an angle, which depends on the depth cut, which is less than the height of the mold encapsulant or the portion of the device (or package) itself. The depth of cut should be such that the wire bonds make contact with a subsequently formed overlying conductive layer and is isolated from the bond pads located at the bottom of the device portion. If the package cut angle is wide relative to the width of the device portion, a pyramid instead of a triangular cut (or substantially "V" cut or substantially "V" groove), which is illustrated in FIG. 7, is undesirably achieved. The (shallow) pyramid cut may interfere or destroy components inside the device portion and may not allow for any space to mark the device portion with a code as is typically performed later in the process flow. Pyramid type structures may also make testing the device portion difficult. For a depth of approximately 80 mills an angle of approximately 70 degrees for the saw blade tip is suitable. It is preferred that the sidewalls of the groove 40 be sloped so that during subsequent processing when a conductive layer is deposited onto the groove 40 the conductive layer will coat the sidewalls of the groove 40. The groove should not extend all the way through the leadframe 10 or else the subsequent conductive layer will coat the sidewalls of the groove and create a short with packaging leads that are subsequently connected to the conductive layer. Cutting too deep into the lead frame can also compromise the mechanical integrity of the lead frame and can make handling or processing difficult in a manufacturing environment.

Figure 8:
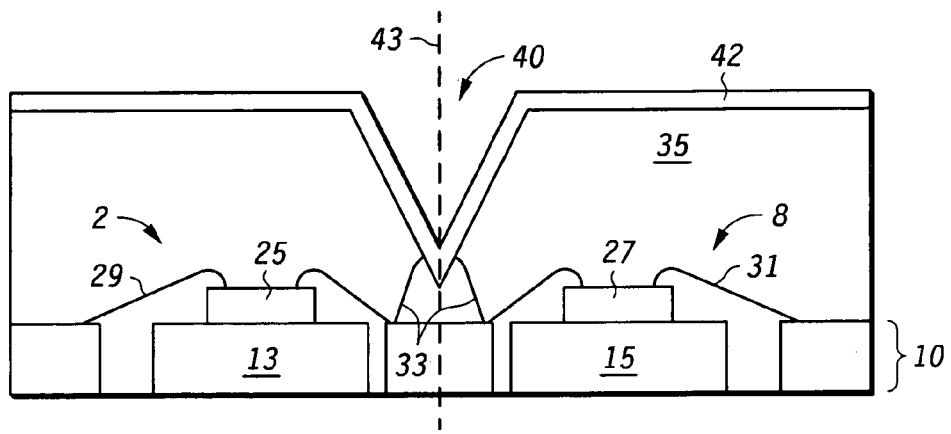
FIG. 8 illustrates a cross-sectional view of the lead frame in FIG. 7 after forming a conductive layer in accordance with an embodiment of the present invention.

FIG. 8 illustrates the deposition of the conductive layer 42. The conductive layer 42 can be a polymer, metal, metal alloy (such as a ferromagnetic or ferroelectric material), ink, the like or combinations of the above. In one embodiment, the conductive layer is a aluminum (Al), copper (Cu), nickel iron (NiFe), tin (Sn), zinc (Zn), the like or combinations of the above. If the conductive layer 42 is a non-ferrous material (e.g., Al, Cu, Sn and Zn) then the conductive layer 42 and grounded wires 33 serve to protect the device portion from EMI by grounding the semiconductor dies 13 and 15 to the conductive layer 42 via the ground wire bonds 32. If a ferromagnetic material (such as NiFe) is used the conductive layer 42 will protect the device portion from magnetic radiation, which would be useful if semiconductor dies 13 and 15 included a magnetic random access memory (MRAM) device. (Thus, if protection is only needed from predominately magnetic radiation, then the ground wires 33 may not be present.) If, however, both a non-ferromagnetic material and ferromagnetic material (e.g., a layer of copper and a layer of NiFe) are used together to form the conductive layer 42, then the device portion is protected from electromagnetic fields that are both electric and magnetic with a electromagnetic or broadband shield, which might be useful if the semiconductor devices 13 and 15 include both MRAM devices and transistors, for example.

To deposit the conductive layer 42, the surface of the mold encapsulant 32 is prepared so that the conductive layer 32 will adhere to the mold encapsulant 32. In one embodiment, if the conductive layer 42 will be pad printed, then a hydrogen flame is used (i.e., flame-off) to prepare the conductive layer by burning off any organics that may be present. Alternatively, any other process, including no processing, may be performed to prepare the surface of the mold encapsulant 32.

The conductive layer 42 can be deposited by physical vapor deposition (PVD), chemical vapor deposition (CVD), atomic layer deposition (ALD), electrolytic plating, electroless plating, flame spray, conductive paint spray, vacuum metallization, pad printing, the like, or combinations of the above. The conductive layer 42 is preferably 1 to 50 microns in thickness; the thickness of the conductive layer 42 will depend upon the shielding effectiveness desired. The minimum thickness of the conductive layer 42 depends on the process used to form the conductive layer 42 and the maximum thickness depends on the amount of stress of the conductive layer 42, which is a function of at least the material being used.

After the conductive layer 42 is deposited or applied, each device portion is singulated from one another. In other words, each device portion may be cut or sawed into an individual device portion. In one embodiment, a cut is made at the vertex of each groove. Dotted line 43 in FIG. 8 illustrates where singulation of the device portions may occur. (In other words, the dotted line 43 is substantially in line with the vertex of the groove.)

Figure 9:
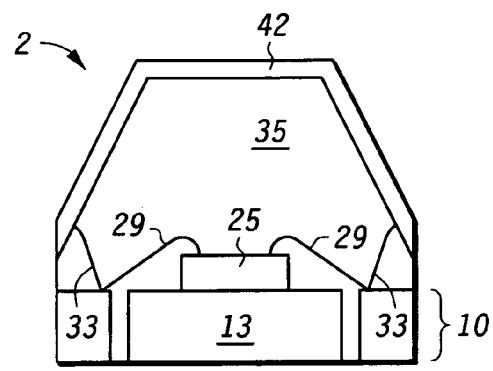
FIG. 9 illustrates a cross-sectional view of a semiconductor package after singulation in accordance with one embodiment of the present invention.

FIG. 9 illustrates singulated second device portion 2, which has one grounded wire 33 on each side of the second semiconductor die 13. Once singulated the second device portion 2 is a semiconductor package. In FIGS. 1–8 only one grounded wire 33 is shown in the second device portion 2 because the device portion that would share the other grounded wire bond 32 (which is not shown) is not illustrated. Instead, only four device portions were illustrated for simplicity. Unless the second device portion 2 is located at a corner or edge of the leadframe 10, the second device portion 2 is likely to have at least two grounded wires 33 such that at least one is located on each side of the semiconductor die 13, as illustrated in FIG. 9. It is likely that the second device portion 2 will have four grounded wires 33 (one at each corner) if the second device portion 2 is surrounded by other device portions on all sides. In the top view figures of FIG. 1–8, two ground wire bonds 32 are shown electrically coupling the second device portion 2 to the fourth device portion 8. Thus, if another device portion is located on the other side of the second device portion 2, then two more ground wire bonds would electrically couple the ground pads 19 (at the top of the figure) to the adjacent device portion (not shown) that would be also at the top of the figure above the second device portion 2.

Since the second device portion 2 will have two grounded wires 33, a groove will also be cut to form both grounded wires 33 and thus a groove will be cut on either side of the semiconductor die 13 and the sidewalls of both grooves will be covered with the conductive layer. Thus, after singulation, which, in one embodiment occurs at the vertex of each groove, the sidewalls or two ends of the second device portion 2 are sloped because they were the (sloped) sidewalls of the grooves.

Although the grounded wire bonds 32, as described above, electrically couple ground pads of different device portions to each other, the grounded wire bonds 32 need not be electrically coupled to ground pads to provide EMI protection. If the layout of the bonds pads, the semiconductor die size, and the flag size permit it, the grounded wire bonds 32 can couple any unused grounded or to be grounded bond pads instead of the grounded pads. In other words, the grounded bond pads can be any unused bond pads if the unused bond pads are grounded or will be subsequently grounded when the device portion is singulated into a package and attached to a printed circuit board (PCB). In general, any grounded portion of one device portion can be electrically coupled to another grounded portion of another, preferably adjacent, device portion by the grounded wire bonds 32. In addition, the conductive portions that are electrically coupled together by the grounded wire bonds 32 need not be the same types of conductive portions. For example, the grounded wire bond 32 may electrically couple a grounded bond pad of one device portion to a bond pad of another device portion. However, coupling different types of conductive portions does increase processing complexity and therefore may be less desirable.

Figure 10:
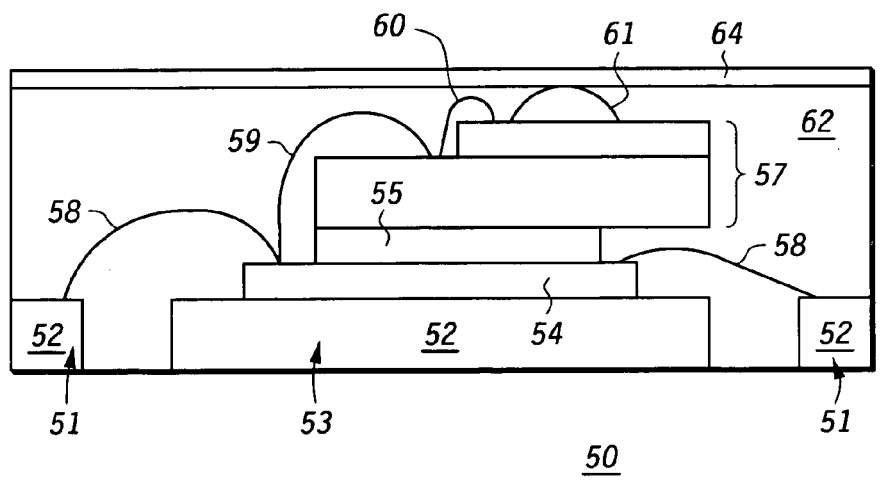
FIG. 10 illustrates a cross-sectional view of a semiconductor package in accordance with another embodiment of the present invention.

FIG. 10 illustrates another embodiment to shield EMI and/or electromagnetic radiation. In this embodiment, a grounded wire 61 is electrically coupled to a grounding plane and forms a loop, which extends outside the package. Package 50 includes a leadframe 52, which includes bond pads 51 and a flag 53 as part of the lead frame 52. In one embodiment the package 50 includes a sensing device. Formed over the flag 53 is a first semiconductor die 54, which includes circuitry to perform ASIC functions, such as a transducer or sensing die. The first semiconductor die 54 is electrically coupled to the bond pads 51 by first wire bonds 58. A spacer 55 is then formed over the first semiconductor die 54 to allow for a larger semiconductor die (second semiconductor die 57) to be stacked over the first semiconductor die 54. The spacer 55 allows the larger semiconductor die, which in one embodiment is sensing die, to overhand over the wire bonds 58 of the first semiconductor die 54. The spacer 55 can also increase the separation between the first semiconductor die 54 and the larger semiconductor die if device parasitics is an issue. The second semiconductor die 57 is electrically coupled by a second wire bond 59 to the first semiconductor die 54. In the embodiment shown in FIG. 10, the second semiconductor die 57 is a sensing die that is protected with a cap wafer of silicon by glass frit sealing. The sealing is attached at the wafer level before the semiconductor die 57 is sawn to become an individual die separated from the others on the wafer. A third wire bond 60 couples a first portion of the second semiconductor die 57 to a second portion of the second semiconductor die 57. If the second semiconductor die 57 and the first semiconductor die 55 are integrated into one die having both functions, for example ASIC and sensing functions, then the spacer 55 is not needed. The configuration of semiconductor die in FIG. 10 is illustrative. The package 50 may have one or a plurality of die that are placed on a flag within the same plane or stacked relative to each other. A grounded wire bond 61 is formed on the third semiconductor die 57 and forms a loop. All the wire bonds can be any material and have any characteristics previously discussed for wire bonds.

A mold encapsulant 62, which can be any mold encapsulant material such as those discussed above, is formed over the semiconductor dies, the lead frame 52 and the wire bonds. After forming the mold encapsulant 62, a de-flash or clean is performed to expose the grounded wire bond 61. Any conventional de-flash or clean can be used. The deflash process may involve no processing, a chemical process, a high pressure water process or a mechanical process.

After exposing a portion of the grounded wire bond 61, a conductive layer 64, which can be any materials discussed above for the conductive layer 42, is formed over the mold encapsulant 62 and the exposed portion of the grounded wire bond 61. In other words, the conductive layer held at ground and the flag 52 form an EMI or electromagnetic shield, depending on the material used for the conductive layer 62. Thus, the grounded wire bond 61 is coupled to the conductive layer 64 and is thereby grounded. Semiconductor package 50 shown in FIG. 10 is formed by singulating the package after forming the conductive layer 64.

Other embodiments can also be used to form an EMI and/or electromagnetic shied. For example, a metallic tab with formed leads can be attached through an adhesive to the top surface of a package. In one embodiment, the metallic tab completely covers the top of the package and the formed leads of the metallic tab align with ground leads. In accordance with this embodiment, the printed circuit board (PCB) may have extensions for the formed leads of the metallic tab to be grounded. The material used for the metallic tab can be the same as those used for the conductive layers 42 and 64.

In yet another embodiment, a metallized substrate is formed over a semiconductor die, which is attached to the flag of a leadframe, which is one embodiment is performed using a standard flip chip process. The metallized substrate should completely cover the semiconductor die. In other words, the semiconductor die has a first width and a first length and the metallized substrate has a second width and a second length, wherein the second width is equal to or greater than the first width and the second length is equal to or greater than the first length.

A spacer is provided for clearance of the wire bonds between the metallized substrate and the bond pads of the lead frame. Without clearance the wire bonds between the metallized substrate and the bond pads may interfere or touch the wire bond between the semiconductor die and the bond pad. Thus, an internal shield is created using a grounded metallized substrate stacked on top of the semiconductor die, wherein the internal shield covers circuitry on the semiconductor die and optionally, the wire bonds as well. THE semiconductor die may include any type of circuitry, including MRAM, RF, microcontrollers, EPROM, and DRAM. As discussed above, if the semiconductor die includes MRAM it is desirable for the metallized substrate to shield omagnetic radiation. It may also be desirable for the metallized substrate to shield EMI and in this embodiment, the metallized substrate may include two different materials to have both electrical and magnetic shielding capability.

By now it should be appreciated that there has been provided a process for forming an EMI and/or electromagnetic shield at the component level. The process is desirable, especially for QFN's, because the processing can be performed without the need for additional processing equipment. Furthermore, this process is a cost effective way to prevent EMI and/or electromagnetic radiation at the component level, especially the process described in FIGS. 1–9. Using a wire to ground a conductive layer is especially useful for packages that are array molded (i.e., neither premolded nor molded individually), such as a QFN. Premolded packages, like ceramic leadless chip carriers (CLCC that are manufactured using various ceramic layers, can prevent EMI by having a top metal cap grounded and soldered to the bottom ground plane by a via. In WFN or other packages that have lead frames exposed on a first side and multiple array packaging (MAP) molded on a second side, molding compound covers the entire second side. Since the individual devices in that MAP molded lead frame are placed close to each other, individual caps could not be placed for each device and held in place during the molding process. Increasing the distance between adjacent devices and using individual caps before molding can be very expensive in addition to other technical challenges. Placing and holding the individual caps can be difficult and can obstruct the molding process itself. Due to the process flow of non premolded packages a metal cap cannot be used. Moreover, the process used for putting vias in CLCC is different from that of the molding process used to form QFN, BGA, etc. type packages. For example, to form vias in a QFN type package, the vias would have to be formed in the mold encapsulant, which can increase manufacturing costs and complexity.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Although the invention has been described with respect to specific conductivity types or polarity of potentials, skilled artisans appreciated that conductivity types and polarities of potentials may be reversed.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term "another", as used herein, is defined as at least a second or more. The term "coupled", as used herein, is defined as connected, although not necessarily directly, and not necessarily mechanically. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

What is claimed is:

1. A semiconductor package comprising:
   a leadframe having a flag and a bond pad;
   a semiconductor die attached to the flag and electrically coupled to the bond pad;
   a mold encapsulant over the semiconductor die;
   a conductive layer over the mold encapsulant, wherein the conductive layer comprises a ferromagnetic material; and
   a wire electrically coupling the leadframe to the conductive layer.

2. The semiconductor package of claim 1, wherein the conductive layer comprises NiFe.

3. The semiconductor package of claim 1, wherein the conductive layer comprises an element selected from the group consisting of aluminum, copper, tin and zinc.

4. The semiconductor package of claim 1, wherein the conductive layer comprises a ferromagnetic material and a nonferromagnetic metal.

5. The semiconductor package of claim 1, wherein the wire is coupled to the semiconductor die.

6. The semiconductor package of claim 1, wherein the wire is coupled to the leadframe through a pad.

7. The semiconductor package of claim 1, wherein the conductive layer is an electromagnetic shield.

8. A method of forming a semiconductor package, the method comprising:
   providing a leadframe having a flag;
   attaching a semiconductor die to the flag;
   forming a mold encapsulant over the semiconductor die;
   forming a conductive layer over the mold encapsulant, wherein forming a conductive layer further comprises electrically coupling the conductive layer to the wire; and
   electrically coupling the leadframe to the conductive layer using a wire, wherein electrically coupling the leadframe to the conductive layer using a wire further comprises:
   providing a wire having a first end and a second end:
   electrically coupling the first end and the second end of the wire to the semiconductor die: and
   removing a portion of the mold encapsulant to expose a portion of the wire.

9. The method of claim 8, wherein:
   forming a mold encapsulant over the semiconductor die, further comprises forming the mold encapsulant over the wire.

10. The method of claim 9, wherein removing the mold encapsulant to expose the wire further comprises forming a groove in the mold encapsulant, wherein the groove has sidewalls.

11. The method of claim 10, wherein forming the conductive layer further comprises forming the conductive layer over the sidewalls of the groove.

* * * * *